(12) United States Patent  
Wu (10) Patent No.: US 10,483,963 B2  
(45) Date of Patent: Nov. 19, 2019

(54) CONTROL CIRCUIT FOR CONTROLLING RESET OPERATION

(71) Applicant: RichWave Technology Corp., Taipei (TW)

(72) Inventor: Juang-Shiung Wu, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 15/878,363

(22) Filed: Jan. 23, 2018

(65) Prior Publication Data

US 2018/0367136 A1 Dec. 20, 2018

(30) Foreign Application Priority Data

Jun. 16, 2017 (TW) .............................. 10612074 A (51) Int. Cl.
*H03K 17/22* (2006.01)
*H03L 7/08* (2006.01)
*H03L 7/18* (2006.01)

(52) U.S. Cl.
CPC ............. *H03K 17/22* (2013.01); *H03L 7/08* (2013.01); *H03L 7/18* (2013.01)

(58) Field of Classification Search
CPC .............. H03K 17/22; H03L 7/08; H03L 7/18
See application file for complete search history.

(56) References Cited

U.S. PATENT DOCUMENTS

| 6,629,257 B1* | 9/2003 | Hartwell ................ G06F 1/24 713/500 |
| 7,504,893 B2 | 3/2009 | Gonzalez |
| 7,522,898 B2 | 4/2009 | Heidari |
| 7,680,236 B1 | 3/2010 | Melanson |
| 9,240,795 B2* | 1/2016 | Reichelt ................. H03L 7/18 |
| 2015/0028957 A1* | 1/2015 | Suzuki ................ H03L 7/0992 331/25 |
| 2017/0010933 A1* | 1/2017 | Wang ................. G06F 11/0736 |

FOREIGN PATENT DOCUMENTS

TW 174961 12/1991

* cited by examiner

*Primary Examiner* — Daniel C Puentes  
(74) *Attorney, Agent, or Firm* — Winston Hsu (57) ABSTRACT

A control circuit includes a reset circuit and a determination circuit. The reset circuit is coupled to a digital frequency divider of a phase locked loop circuit and configured to perform a reset operation. The determination circuit is coupled to the reset circuit and configured to determine whether a first predetermined time interval has elapsed so as to control the reset circuit to stop performing the reset operation when the first predetermined time interval has elapsed.

6 Claims, 7 Drawing Sheets

CONTROL CIRCUIT FOR CONTROLLING RESET OPERATION

CROSS REFERENCE TO RELATED APPLICATION

This application claims priority to Taiwan Patent Application No. 106120174, filed Jun. 16, 2017, and incorporated herein by reference in its entirety.

TECHNICAL FIELD

The present invention is related to a control circuit capable of controlling a reset operation according to whether a predetermined time interval has elapsed.

BACKGROUND

Figure 1:
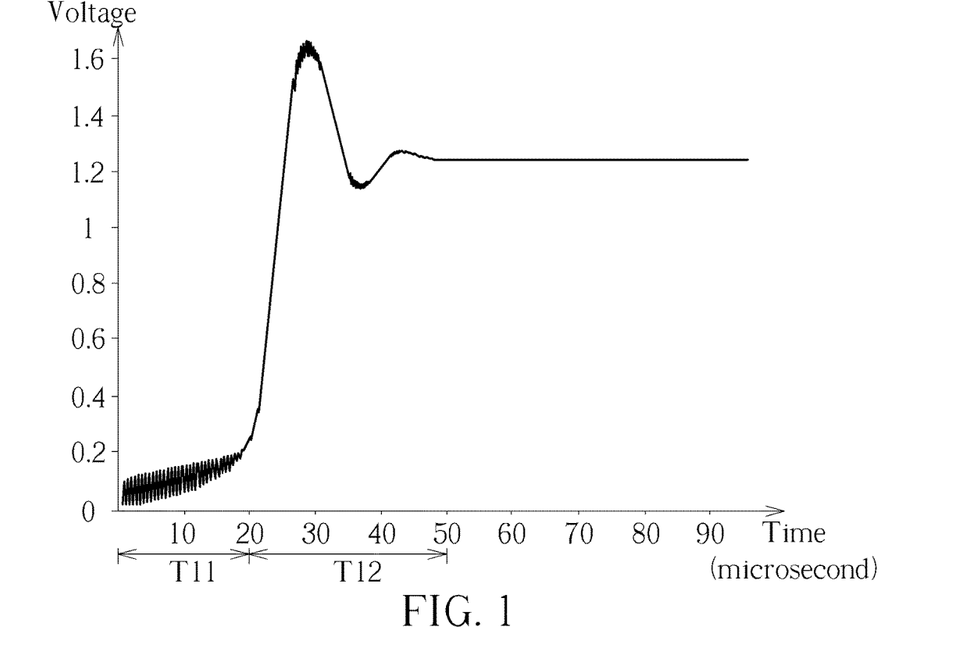
FIG. 1 illustrates an output voltage-time curve of a functional circuit according to prior art.

When operating a functional circuit, it requires excessive setting time for the functional circuit to stabilize, and this has been a problem to be solved in the field. FIG. 1 illustrates an output voltage-time curve of a functional circuit according to prior art. In FIG. 1, the functional circuit may be a phase locked loop circuit as an example. The horizontal axis is time, and the vertical axis refers to an output voltage of a phase locked loop circuit. As shown in FIG. 1, when the functional circuit is initialized, the output voltage is unstable during a time interval T11. The output voltage is unstable because the negative feedback mechanism of the functional circuit has not yet stabilized.

As shown in FIG. 1, after the time interval T11 has elapsed, it still requires a time interval T12 for the output voltage to stabilize. Thus the setting time to stabilize the output voltage is at least a sum of the time intervals T11 and T12. This makes the functional circuit highly inefficient. Hence, a solution is required for solving a problem of that the setting time is excessive.

SUMMARY

An embodiment provides a control circuit including a reset circuit and a determination circuit. The reset circuit is coupled to a digital frequency divider of a phase locked loop circuit and configured to perform a reset operation. The determination circuit is coupled to the reset circuit and configured to determine whether a first predetermined time interval has elapsed so as to control the reset circuit to stop performing the reset operation when the first predetermined time interval has elapsed.

Another embodiment provides a control circuit including a reset circuit and a determination circuit. The reset circuit is coupled to a digital circuit of a functional circuit and configured to perform a reset operation to the digital circuit. The determination circuit is coupled to the reset circuit and configured to determine whether a first predetermined time interval has elapsed so as to control the reset circuit to stop performing the reset operation when the first predetermined time interval has elapsed. The functional circuit includes an analog circuit and a digital circuit coupled to the analog circuit.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 2:
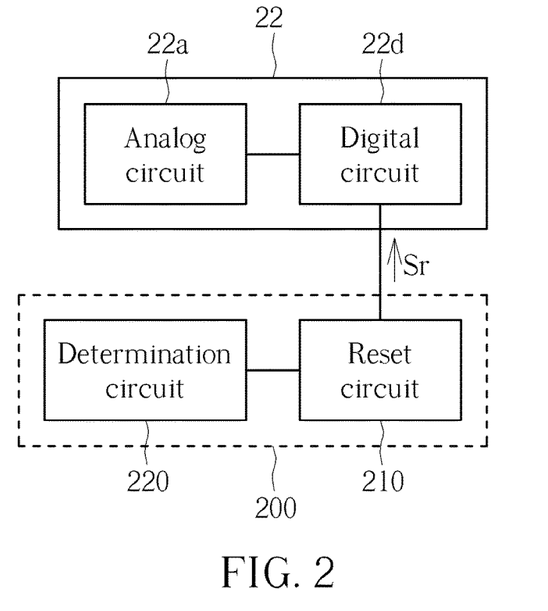
FIG. 2 illustrates application of a control circuit according to an embodiment.

FIG. 2 illustrates application of a control circuit 200 according to an embodiment. The control circuit 200 may include a reset circuit 210 and a determination circuit 220. The reset circuit 210 may be coupled to a digital circuit 22d of a functional circuit 22 and used to perform a reset operation to the digital circuit 22d. For example, performing the reset operation may be transmitting at least one reset signal Sr to reset the digital circuit 22d. The determination circuit 220 may be coupled to the reset circuit 210 and used to determine whether a predetermined time interval T1 has elapsed so as to control the reset circuit 210 to stop performing the reset operation when the predetermined time interval T1 has elapsed. For example, stopping performing the reset operation may be stopping transmitting the at least one reset signal Sr, or converting the reset signal Sr from an enabling level to a disabling level. Converting the reset signal Sr from an enabling level to a disabling level may be converting the reset signal Sr from a high level to a low level, or from a low level to a high level according to a reset level of the digital circuit 22d. As shown in FIG. 2, the reset circuit 210 may include an output terminal to perform the reset operation or stop performing the reset operation.

The functional circuit 22 may also include an analog circuit 22a coupled to the digital circuit 22d. According an embodiment, the functional circuit 22 may be a phase locked loop circuit. The functional circuit 22 of FIG. 2 may merely illustrate a partial and simplified diagram of the foresaid phase locked loop circuit. The digital circuit 22d may be a digital frequency divider of the phase locked loop circuit, and the analog circuit 22a may be an analog frequency divider of the phase locked loop circuit. The predetermined time interval T1 may correspond to a time required for the analog circuit 22a to stabilize.

Figure 3:
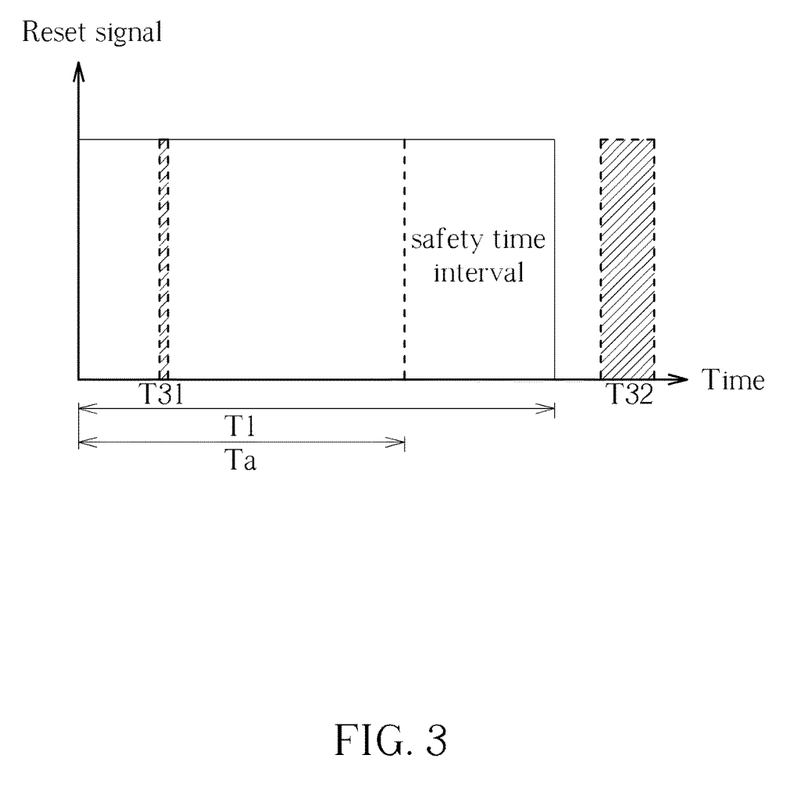
FIG. 3 illustrates a signal waveform diagram of the reset circuit of FIG. 2 according to an embodiment.

FIG. 3 illustrates a signal waveform diagram when the reset circuit 210 of FIG. 2 performs the reset operation and stops performing the reset operation. In the example of FIG. 3, the enabling level of the reset signal Sr is a high level, and the disabling level of the reset signal Sr is a low level. This setting is merely an example instead of limiting the scope. As shown in FIG. 3, the reset circuit 210 may perform the reset operation during the predetermined time interval T1 to reset the digital circuit 22d, and stop performing the reset operation when the predetermined time interval T1 has elapsed.

For example, if the analog circuit 22a requires a time interval Ta to stabilize, the predetermined time interval T1 may be set substantially equal to or even longer than the time interval Ta for ensuring that the reset circuit 210 may perform or stop performing the reset operation effectively. This is because that the time interval required by the analog circuit 22a to stabilize may vary by external factors such as manufacturing process and ambient temperature. In the example of FIG. 3, the reset circuit 210 may perform the reset operation (e.g. keeping transmitting at least one reset signal Sr) to the digital circuit 22d before the analog circuit 22a stabilizes, and the reset circuit 210 may keep performing the reset operation for a safety time interval after the analog circuit 22a has stabilized before stopping performing the reset operation. This may avoid the unstable output voltage occurring during the time interval T11 in FIG. 1, and alleviate the problem of the excessive setting time. The foresaid safety time interval may be 10% of the time interval Ta or another suitable time interval. It is useless for shortening the setting time of the functional circuit 22 to perform the reset operation before the analog circuit 22a has stabilized (e.g. transmitting the reset signal Sr during the time interval T31). However, it is also useless for shortening the setting time of the functional circuit 22 to perform the reset operation after the safety time interval has elapsed after the analog circuit 22a has stabilized (e.g. transmitting the reset signal Sr during the time interval T32). Hence, the predetermined time interval T1 may be substantially longer than time interval Ta. The difference of the predetermined time interval T1 and time interval Ta (i.e. (T1−Ta)) may not be longer than the safety time interval for preventing that the desired effect of shortening the setting time of the functional circuit 22 cannot be obtained. Thus, the reset operation may be performed to the digital circuit 22d constantly till the safety time interval has elapsed after the analog circuit has stabilized, and then the reset operation may be stopped so as to optimize the shortening of the setting time of the functional circuit 22.

Figure 4:
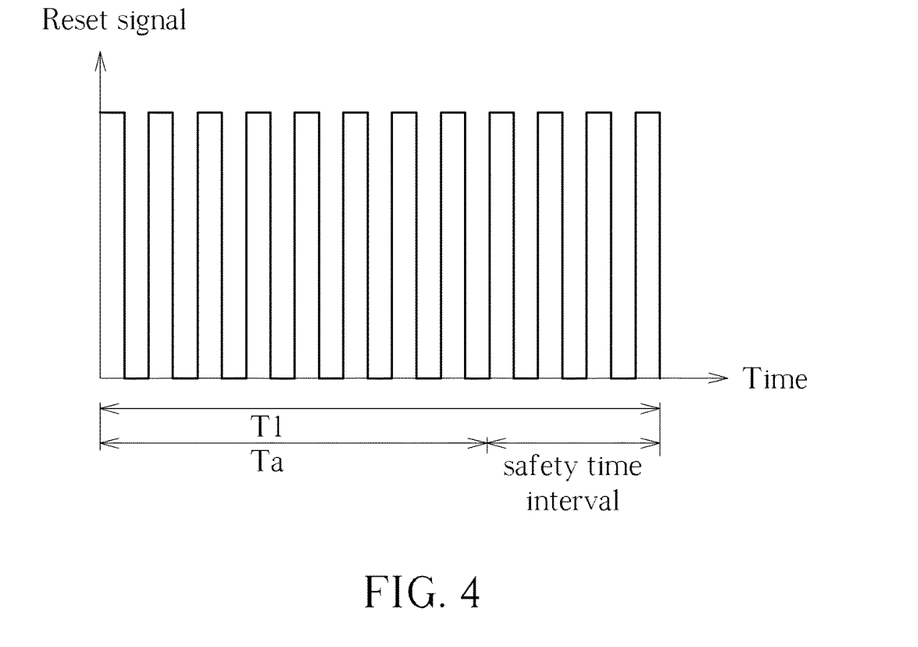
FIG. 4 illustrates a signal waveform diagram of the reset circuit of FIG. 2 according to another embodiment.

FIG. 4 illustrates a signal waveform diagram when the reset circuit 210 of FIG. 2 performs the reset operation and stops performing the reset operation according to another embodiment. FIG. 4 may be compared with FIG. 3. In the embodiment of FIG. 3, transmitting the reset signal Sr constantly during the predetermined time interval T1 is to keep reset signal Sr at an enabling level (e.g. a high level). In the embodiment of FIG. 4, transmitting the reset signal Sr constantly during the predetermined time interval T1 is to transmit the at least one reset signals Sr each having a pulse waveform continually during the predetermined time interval T1, and stop performing the reset operation by stopping transmitting the reset signal Sr when the predetermined time interval T1 has elapsed. The signal waveform of FIG. 4 may be useful to shorten the setting time of the functional circuit 22.

Figure 5:
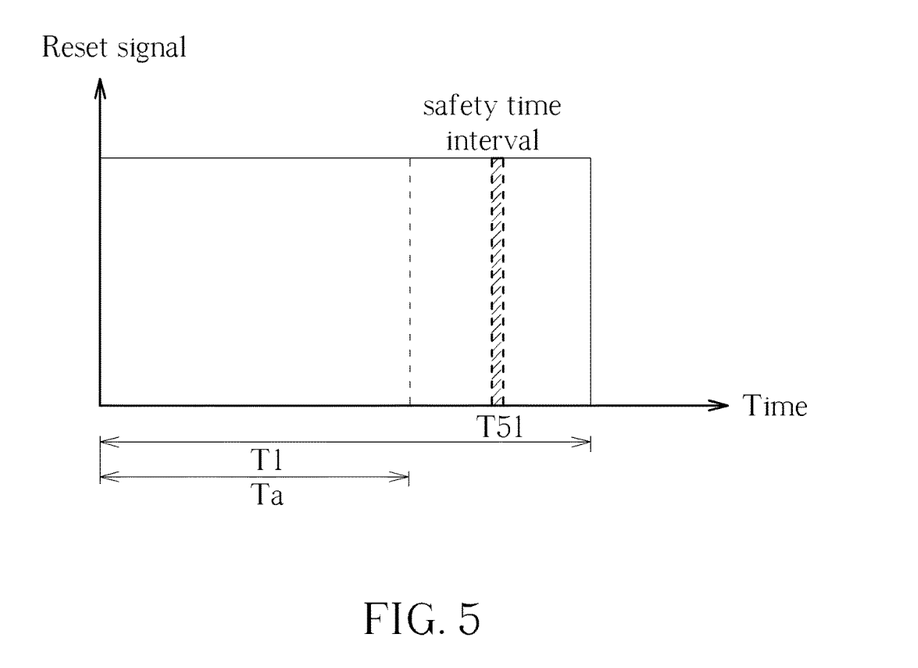
FIG. 5 illustrates a signal waveform diagram of the reset circuit of FIG. 2 according to another embodiment.

FIG. 5 illustrates a signal waveform diagram when the reset circuit 210 of FIG. 2 performs the reset operation and stops performing the reset operation according to another embodiment. As mentioned above, a time interval between a time point on which the time interval Ta finishes and another time point on which the predetermined time interval T1 finishes may be the safety time interval. It may be assured that the analog circuit 22a has stabilized, and the digital circuit 22d may be reset effectively during the safety time interval. Hence, at least one reset signal Sr may be transmitted during the time interval T51 to reset the digital circuit 22d. After the time interval T51, it may be stopped to reset the digital circuit 22d. Since the digital circuit 22d is reset during the safety time interval, the setting time of the functional circuit 22 may be effectively shortened.

Figure 6:
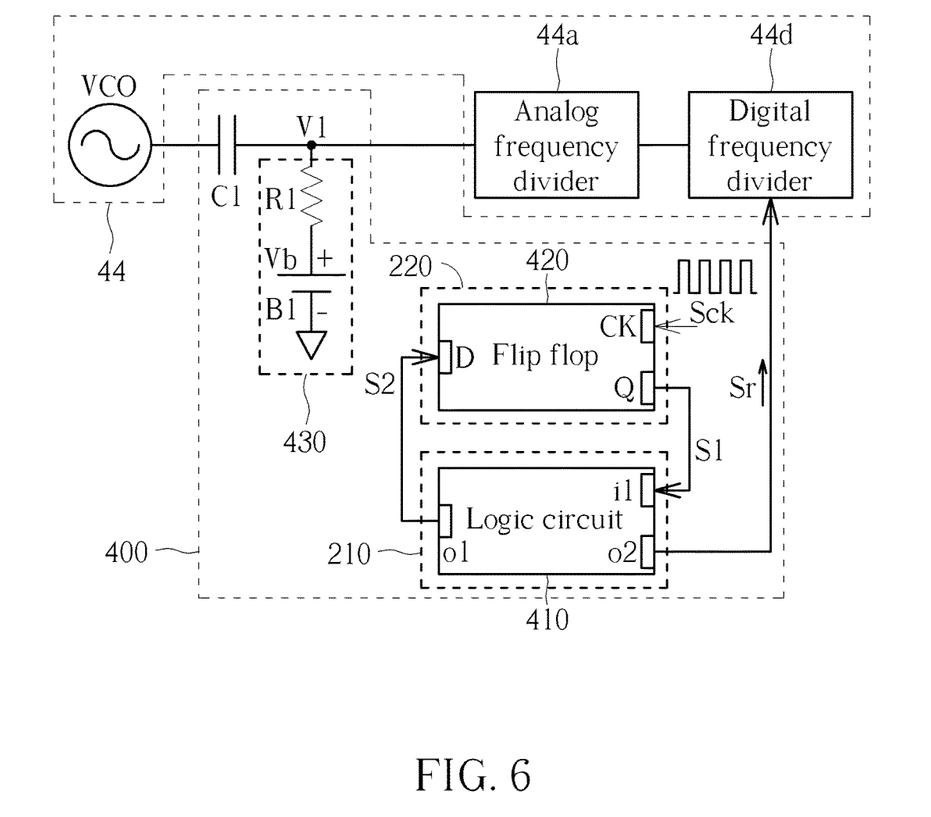
FIG. 6 illustrates application of a control circuit according to another embodiment.

FIG. 6 illustrates application of a control circuit 400 according to an embodiment. The control circuit 400 may be an embodiment of the control circuit 200 of FIG. 2. The foresaid functional circuit may be a phase locked loop circuit. A phase locked loop circuit 44 in FIG. 6 may be a partial and simplified structure of a phase locked loop circuit. The digital circuit may be a digital frequency divider 44d of the phase locked loop circuit 44, and the analog circuit may be an analog frequency divider 44a of the phase locked loop circuit 44. The determination circuit 220 may include a flip flop 420. The reset circuit 210 may include a logic circuit 410. The flip flop 420 may include a clock terminal CK, an input terminal D and an output terminal Q. The clock terminal CK may be coupled to a clock source and used to receive a clock signal Sck having a clock waveform. The input terminal D may be used to receive second data S2. The output terminal Q may be used to output first data S1 according to the second data S2 and the clock signal Sck.

For example, the first data S1 may be updated and outputted according to the second data S2 at the rising edge or falling edge of the clock signal Sck. The logic circuit 410 may shift the first data S1 by a fixed value so as to update the second data S2. For example, if the shifting operation is a subtraction calculation, and the fixed value is one, the operation of the logic circuit 410 may be represented as an equation S2=S1−1. The logic circuit 410 and the flip flop 420 may thus perform a backward counting operation. In other examples, the logic circuit 410 and the flip flop 420 may perform another backward counting operation by subtracting another subtrahend or a forward counting operation. The logic circuit 410 may include an input terminal i1, an output terminal o1 and another output terminal o2. The input terminal i1 may be coupled to the output terminal Q of the flip flop 420 and used to receive the first data S1. The output terminal o1 may be coupled to the input terminal D of the flip flop 420 and used to output the second data S2. The output terminal o2 may be coupled to the output terminal of the reset circuit 210 to be coupled to the digital frequency divider 44d to perform the reset operation or stop performing the reset operation. When the first data S1 has reached a constant Ct1, the logic circuit 410 may stop performing the reset operation through the output terminal o2. When the first data S1 has not yet reached the constant Ct1, the logic circuit 410 may perform the reset operation through the output terminal o2. The constant Ct1 may be corresponding to the predetermined time interval T1. Stopping performing the reset operation may be stopping transmitting the at least one reset signal Sr to the digital frequency divider 44d or converting the reset signal Sr from an enabling level to a disabling level. Performing the reset operation may be as described in FIG. 3 to FIG. 5.

For example, if the constant Ct1 is zero, the fix value is one, and an initial value of the first data S1 is 2000, when the logic circuit 410 and the flip flop 420 perform a backward counting operation with the pulse of the clock signal Sck, the first data S1 may be gradually updated to be 1999, 1998, 1997, . . . , until the constant Ct1 (i.e. 0 in this example) has reached. When the first data S1 has not reached the constant Ct1, the logic circuit 410 may perform the reset operation to the digital frequency divider 44d as described in FIG. 3 to FIG. 5 by transmitting at least one reset signal Sr. When the first data S1 has reached the constant Ct1, the logic circuit 410 may stop performing the reset operation by stopping transmitting the at least one reset signal Sr or converting the level of the reset signal Sr from an enabling level to a disabling level. The initial value of the first data S1 and the constant Ct1 may be set corresponding to the predetermined time interval T1. Hence, the determination circuit 220 may determine whether the predetermined time interval T1 has elapsed by counting.

As shown in FIG. 6, the control circuit 400 may further include an operation voltage generation circuit 430 and a capacitor C1. The operation voltage generation circuit 430 may include an output terminal coupled to the analog frequency divider 44a. The capacitor C1 may include a first terminal coupled to the output terminal of the operation voltage generation circuit 430, and a second terminal. The phase locked loop circuit 44 may further include an oscillation source VCO coupled to the second terminal of the capacitor C1. The oscillation source VCO may be (but not limited to) a voltage controlled oscillator. The predetermined time interval T1 may correspond to the time required for a voltage V1 of the first terminal of the capacitor C1 to reach a ratio of a predetermined voltage. For example, when the analog frequency divider 44a stabilizes from an unstable state, the capacitor C1 may be charged gradually, so the voltage V1 may increase. The time for the voltage V1 to reach the ratio (e.g. 90%) of the predetermined voltage (e.g. a maximum value of the voltage V1) may correspond to the predetermined time interval T1. The foresaid predetermined voltage and the ratio may be set according to the predetermined time interval T1.

According to an embodiment, as shown in FIG. 6, the operation voltage generation circuit 430 may include a bias voltage generator B1 and a resistor R1. The bias voltage generator B1 may include an output terminal used for providing a bias voltage Vb where the bias voltage Vb is a stable value substantially. The resistor R1 may include a first terminal coupled to the output terminal of the operation voltage generation circuit 430, and a second terminal coupled to the output terminal of the bias voltage generator B1 for receiving the bias voltage Vb.

For example, if the bias voltage generator B1 is a 1.5 volt battery, the bias voltage Vb may be 1.5 volts. The bias voltage Vb may charge the capacitor C1 through the resistor R1. In the example of FIG. 6, the voltage provided by the oscillation source VCO may have an oscillating waveform. The mean value of the voltage provided by the oscillation source VCO to the second terminal of the capacitor C1 may be 0.5 volts. The voltages at the two terminals of the capacitor C1 may be substantially equal initially, and then the voltage V1 may rise from 0.5 volts to 1.5 volts when the capacitor C1 is charged. In this example, the maximum value of the voltage V1 may be 1.5 volts. Thus, it may be defined that when the voltage V1 has reached a ratio (e.g. 90%) of 1.5 volts, the predetermined time interval T1 has elapsed.

Figure 7:
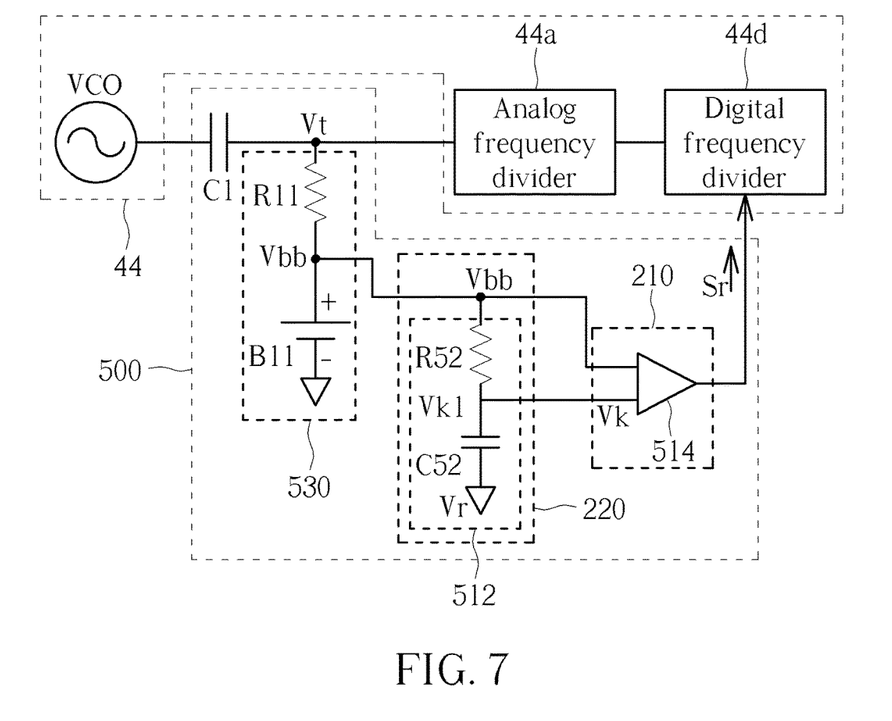
FIG. 7 illustrates application of a control circuit according to another embodiment.

FIG. 7 illustrates application of a control circuit 500 according to an embodiment. The control circuit 500 may be an embodiment of the control circuit 200 of FIG. 2. The determination circuit 220 may be coupled to the analog frequency divider 44a to determine whether the predetermined time interval T1 has elapsed according to a tested voltage Vt of the analog frequency divider 44a. Like FIG. 6, FIG. 7 shows that the phase locked loop circuit 44 may be an example of the functional circuit. The phase locked loop circuit 44 in FIG. 7 may be a partial and simplified structure of a phase locked loop circuit. The phase locked loop circuit 44 may include the digital frequency divider 44d, the analog frequency divider 44a and the oscillation source VCO. The control circuit 500 may include an operation voltage generation circuit 530 and the capacitor C1. The operation voltage generation circuit 530 may include an output terminal coupled to the input terminal of the analog frequency divider 44a. The input terminal of the analog frequency divider 44a may receive the tested voltage Vt. The first terminal of the capacitor C1 may be coupled to the output terminal of the operation voltage generation circuit 530. The predetermined time interval T1 may correspond to a time required for a voltage of the first terminal of the capacitor C1 to reach a ratio of a predetermined voltage.

In the example of FIG. 7, the voltage of the first terminal of the capacitor C1 may correspond to the tested voltage Vt. The foresaid predetermined voltage may be a maximum value of the tested voltage Vt. The foresaid ratio may be 90% or another suitable ratio. The second terminal of the capacitor C1 may be coupled to the oscillation source VCO. Like the operation voltage generation circuit 430 in FIG. 6, the operation voltage generation circuit 530 may include a bias voltage generator B11 and a resistor R11. The bias voltage generator B11 may include an output terminal used for providing a bias voltage Vbb where the bias voltage Vbb is a stable value substantially. The resistor R11 may include a first terminal coupled to the output terminal of the operation voltage generation circuit 530, and a second terminal coupled to the output terminal of the bias voltage generator B11 to receive the bias voltage Vbb.

In the control circuit 500, the determination circuit 220 may include a detection circuit 512. The detection circuit 512 may include a first terminal, a second terminal and a third terminal. The first terminal may be coupled to the second terminal of the resistor R11 and used to receive the bias voltage Vbb, and the third terminal may be coupled to a reference voltage terminal Vr. The reset circuit 210 may include a comparator 514. The comparator 514 may include a first terminal coupled to the output terminal of the bias voltage generator B11 to receive the bias voltage Vbb, a second terminal coupled to the second terminal of the detection circuit 512 to receive an operation voltage Vk. The operation voltage Vk may correspond to the tested voltage Vt as described below. The comparator 514 may further include an output terminal coupled to the output terminal of the reset circuit 210 to stop the reset operation when the operation voltage Vk reaches the bias voltage Vbb substantially. For example, the reset operation may be stopped by stopping transmitting the at least one the reset signal Sr or converting the reset signal Sr from an enabling level to a disabling level. The predetermined time interval T1 may correspond to the time required for the operation voltage Vk to reach the bias voltage Vbb substantially.

According to an embodiment, the detection circuit 512 may include a resistor R52 and a capacitor C52. The resistor R52 may include a first terminal coupled to the first terminal of the detection circuit 512, and a second terminal coupled to the second terminal of the detection circuit 512. The capacitor C52 may include a first terminal coupled to the second terminal of the resistor R52, and a second terminal coupled to the third terminal of the detection circuit 512.

Because the bias voltage Vbb (e.g. 1.5 volts) provide by the bias voltage generator B11 may be a stable value substantially, if the mean value of the voltage (e.g. 0.5 volts) provided to the second terminal of the capacitor C1 by the oscillation source VCO is also a stable value, the tested voltage Vt may increase gradually when the capacitor C1 is charged. For example, the tested voltage Vt may increase from 0.5 volts to 1.5 volts gradually. The product of capacitance of the capacitor C1 and resistance of the resistor R11 may be adjusted to equal the product of capacitance of the capacitor C52 and resistance of the resistor R52 substantially. Thus, a voltage Vk1 at a node between the resistor R52 and the capacitor C52 may approach the bias voltage Vbb. For example, the voltage Vk1 may increase from 0 volts to 1.5 volts gradually. By configuring the electric circuit, the voltage Vk1 may vary with the tested voltage Vt, and the operation voltage Vk may vary with the voltage Vk1, so the operation voltage Vk may vary with the tested voltage Vt. The abovementioned voltages are merely provided as examples instead of limiting the scope of the present invention. In FIG. 7, the voltage Vk1 may equal the operation voltage Vk substantially since the two voltages are at one same node. However, as shown in FIG. 8, the voltage Vk1 and the operation voltage Vk may be at different nodes according to another embodiment.

Figure 8:
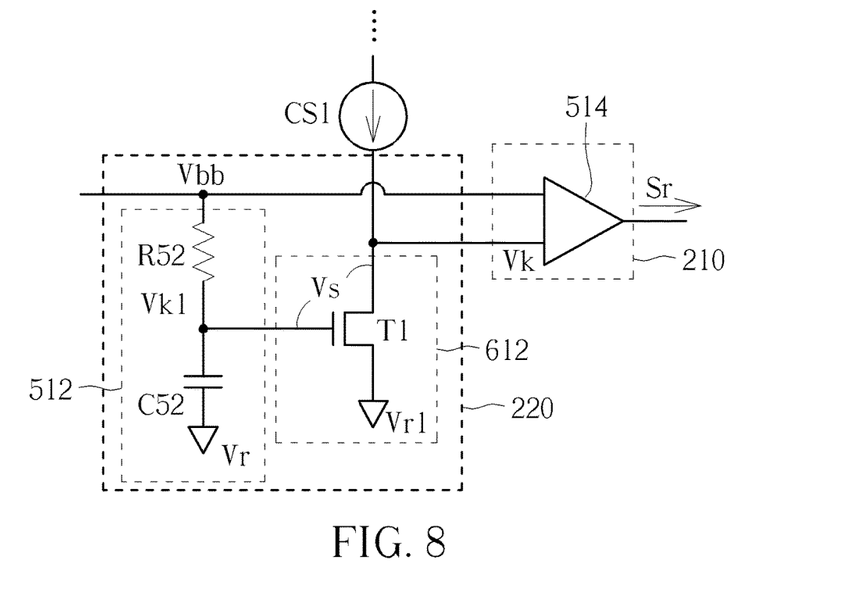
FIG. 8 illustrates a partial circuit of the control circuit of FIG. 7 according to another embodiment.

FIG. 8 illustrates a partial circuit of the control circuit 500 of FIG. 7 according to another embodiment. In FIG. 8, the determination circuit 220 may further include an offset circuit 612 coupled between the second terminal of the detection circuit 512 and the second terminal of the comparator 514 so as to provide an offset voltage Vs. A level of the voltage Vk1 at the second terminal of the detection circuit 512 may therefore be adjusted. For example, the level of the voltage Vk1 may be heightened or lowered. The operation voltage Vk may equal a sum of the voltage Vk1 at the second terminal of the detection circuit 512 and the offset voltage Vs. Because the operation voltage Vk may be higher than the voltage Vk1, and a difference between the operation voltage Vk and the voltage Vk1 may be the offset voltage Vs, the operation voltage Vk may reach the bias voltage Vbb to trigger the comparator 514 to adjust the reset signal Sr when the voltage Vk1 is increased to approach the bias voltage Vbb but has not yet reached the bias voltage Vbb. The offset circuit 612 may be optionally used for circuit design requirements.

As shown in FIG. 8, the offset circuit 612 may include a transistor T1. The transistor T1 may include a first terminal coupled to the second terminal of the comparator 514, a second terminal coupled to a reference voltage terminal Vr1, and a control terminal coupled the second terminal of the detection circuit 512. The first terminal of the transistor T1 may receive a current provided by a current source CS1 so as to have the transistor T1 operate in an saturation region, and have a voltage difference between the control terminal and the first terminal of the transistor T1 equal the offset voltage Vs. This circuit structure may be an example, and other suitable offset circuits may be used according to other embodiments.

Figure 9:
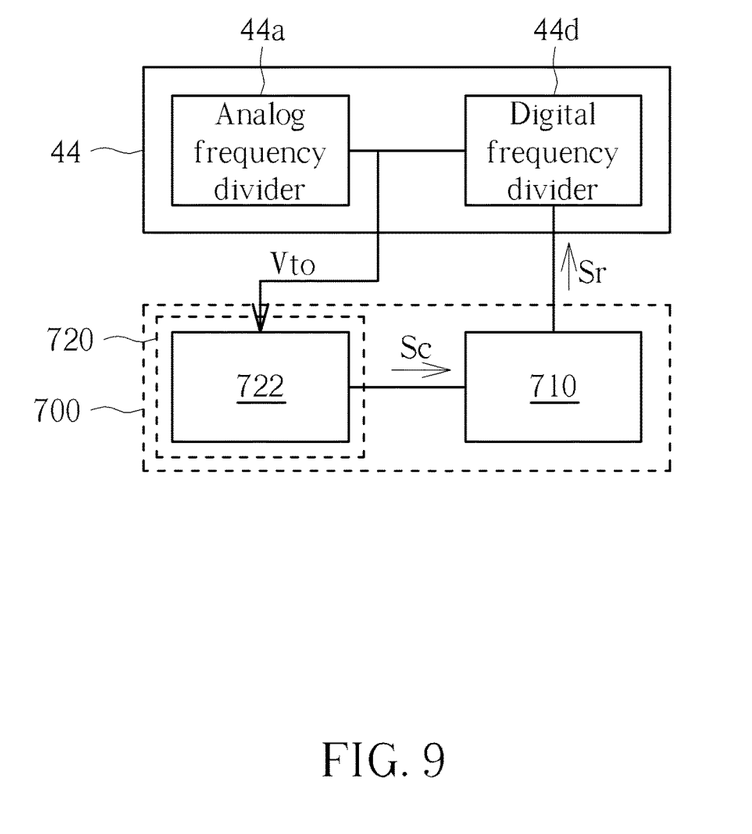
FIG. 9 illustrates application of a control circuit according to another embodiment.

FIG. 9 illustrates application of a control circuit 700 according to another embodiment. The control circuit 700 may be an embodiment of the control circuit 200 of FIG. 2. The control circuit 700 may include a reset circuit 710 and a determination circuit 720. The reset circuit 710 may perform or stop performing a reset operation by using the reset signal Sr. The determination circuit 720 may include a detection circuit 722. The detection circuit 722 may include an input terminal and an output terminal, the input terminal may be coupled to the output terminal of the analog frequency divider 44a for receiving a tested voltage Vto, and the output terminal may be used to output a control signal Sc. The detection circuit 722 may determine that the analog frequency divider 44a has stabilized, and the output terminal of the detection circuit 722 may output the control signal Sc when the tested voltage Vto has reached a threshold. The threshold may be a ratio of a predetermined voltage (e.g. a maximum value of the tested voltage Vto) or a specific threshold voltage. The threshold may correspond to the stabilization of the analog frequency divider 44a, and the predetermined time interval T1 may be the time required for the analog frequency divider 44a to stabilize. The reset circuit 710 may include a control terminal coupled to the output terminal of the detection circuit 722 to receive the control signal Sc, and an output terminal coupled to the digital frequency divider 44d to stop performing the reset operation according to the control signal Sc. Thus, the determination circuit 720 may determine whether the predetermined time interval T1 has elapsed according to the tested voltage Vto at the output terminal of the analog frequency divider 44a, and the predetermined time interval T1 may correspond to a required time for the tested voltage Vto to reach the threshold substantially.

Figure 10:
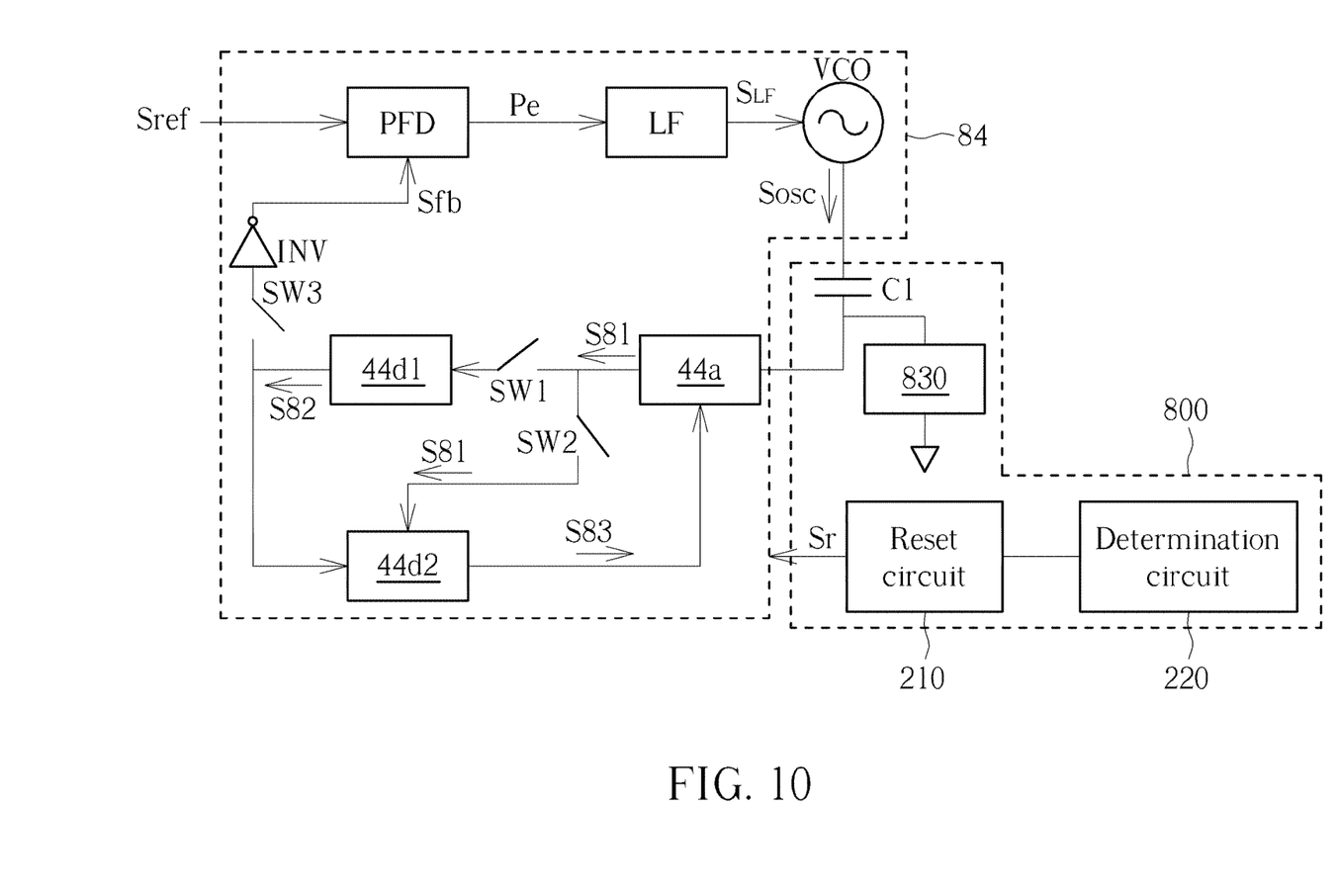
FIG. 10 illustrates application of a control circuit according to another embodiment.

FIG. 10 illustrates application of a control circuit 800 according to another embodiment. In FIG. 10, more functional blocks of a phase locked loop circuit are illustrated. The phase locked loop circuit 84 in FIG. 10 may include a phase frequency detector PFD, a low pass filter LF, an inverter INV, an oscillation source VCO, the analog frequency divider 44a, and digital frequency dividers 44d1 and 44d2. According to an embodiment, the analog frequency divider 44a may be a high speed prescaler, and the digital frequency dividers 44d1 and 44d2 may be low speed frequency dividers. The phase frequency detector PFD may generate a phase difference Pe and output the phase difference Pe to the low pass filter LF according to a reference signal Sref and a feedback signal Sfb. The low pass filter LF may generate a filtered signal $S_{LF}$ and output the filtered signal $S_{LF}$ to the oscillation source VCO according to the phase difference Pe, and the oscillation source VCO may output the oscillation signal $S_{osc}$ according to the filtered signal $S_{LF}$. The analog frequency divider 44a may output a frequency divided signal S81 to the digital frequency dividers 44d1 and 44d2 accordingly. The digital frequency divider 44d1 may output a frequency divided signal S82 to the inverter INV and the digital frequency divider 44d2, and the digital frequency divider 44d2 may output the frequency divided signal S83 to the analog frequency divider 44a accordingly. The inverter INV may output the feedback signal Sfb according to the frequency divided signal S82. The functional blocks of the phase locked loop circuit 84 may form a negative feedback structure. According to an embodiment, the phase frequency detector PFD may include a charge pump.

As shown in FIG. 10, the phase locked loop circuit 84 may further include at least one switch. A switch SW1 may be coupled between the output terminal of the analog frequency divider 44a and the input terminal of the digital frequency divider 44d1. A switch SW2 may be coupled between the output terminal of the analog frequency divider 44a and the input terminal of the digital frequency divider 44d2. A switch SW3 may be coupled between the output terminal of the digital frequency divider 44d1 and the input terminal of the inverter INV. As shown in FIG. 10, the switch SW3 may be coupled among the inverter INV and the digital frequency dividers 44d1 and 44d2, and placed on the path from the digital frequency dividers 44d1 and 44d2 to the oscillation source VCO. The control circuit 800 may be similar to the control circuit 200, so the details are not described repeatedly. When the reset circuit of the control circuit 800 performs a reset operation, at least one of the switches SW1 to SW3 may be turned off. When the reset circuit stops performing the reset operation, the switches SW1 to SW3 may be turned on by controlling the reset signal Sr to correctly reset one or both of the digital frequency dividers 44d1 and 44d2 after the analog frequency divider 44a has stabilized for a safety time interval, for example, after the predetermined time interval T1 has elapsed. The predetermined time interval T1 may be set according to the time required for the analog frequency divider 44a to stabilize. The determination circuit of the control circuit 800 may determine whether the predetermined time interval has elapsed by counting or measuring a tested voltage at the analog frequency divider. In FIG. 10, the operation voltage generation circuit 830 may be similar to the foresaid operation voltage generation circuits 430 and 530, so it is not repeated.

In summary, the reset circuit 210 of the control circuit 200 of FIG. 2 may perform a reset operation to the digital circuit 22d of the functional circuit 22, and the determination circuit 220 may determine whether the analog circuit 22a of the functional circuit 22 has stabilized. The reset circuit 210 may stop performing the reset operation after that the analog circuit 22a has stabilized and then a safety time interval has elapsed. During the safety time interval, at least one reset signal Sr may be used to reset the digital circuit 22d. The determination circuit 220 may determine whether the analog circuit 22a has stabilized by determining whether the predetermined time interval T1 has elapsed by counting using a flip flop (e.g. FIG. 6), by observing the tested voltage Vt at the input terminal of the analog frequency divider 44a (e.g. FIG. 7), or by observing the tested voltage Vto at the output terminal of the analog frequency divider 44a (e.g. FIG. 9). The foresaid reset operation may be resetting the digital circuit directly using a reset signal or by controlling a switch of a functional circuit. By means of control circuits provided by the embodiments, a reset operation may be performed constantly till an analog circuit has stabilized, and then the reset operation may be stopped. Therefore, a setting time required for initializing a functional circuit may be effectively shortened, and the efficiency of the control circuit may be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A control circuit, comprising:
   a reset circuit coupled to a digital frequency divider of a phase locked loop circuit and configured to perform a reset operation; and
   a determination circuit coupled to the reset circuit and configured to determine whether a first predetermined time interval has elapsed so as to control the reset circuit to stop performing the reset operation when the first predetermined time interval has elapsed;
   wherein the phase locked loop circuit further comprises an analog frequency divider coupled to the digital frequency divider, and the first predetermined time interval corresponds to a time required for the analog frequency divider to stabilize;
   the determination circuit determines whether the first predetermined time interval has elapsed by counting;
   the phase locked loop circuit further comprises an oscillation source;
   the control circuit further comprises:
      an operation voltage generation circuit, comprising:
         an output terminal coupled to the analog frequency divider; and
         a first capacitor, comprising:
            a first terminal coupled to the output terminal of the operation voltage generation circuit; and
            a second terminal coupled to the oscillation source;
      the reset circuit comprises:
         an output terminal configured to perform the reset operation or stop the reset operation; and
         the first predetermined time interval corresponds to the time required for a voltage of the first terminal of the first capacitor to reach a ratio of a predetermined voltage; and
      the operation voltage generation circuit further comprises a bias voltage generator configured to provide a bias voltage to charge the first capacitor.

2. The control circuit of claim 1, wherein performing the reset operation comprises:
   transmitting at least one reset signals each having a pulse waveform to the digital frequency divider continually;
   keeping a reset signal being transmitted to the digital frequency divider to be at an enabling level; or
   transmitting at least one reset signal to the digital frequency divider after the analog frequency divider of the phase locked loop circuit has stabilized and before the first predetermined time interval has elapsed.

3. The control circuit of claim 2, wherein stopping performing the reset operation comprises stopping transmitting the reset signal to the digital frequency divider.

4. The control circuit of claim 1, wherein:
   the bias voltage generator comprises:
      an output terminal configured to provide the bias voltage, wherein the bias voltage is a stable value substantially; and
   the operation voltage generation circuit further comprises:
   a first resistor, comprising:
      a first terminal coupled to the output terminal of the operation voltage generation circuit; and
      a second terminal coupled to the output terminal of the bias voltage generator and configured to receive the bias voltage.

5. The control circuit of claim 1, wherein:
   the determination circuit comprises a flip flop comprising:
      a clock terminal coupled to a clock source and configured to receive a clock signal;
      an input terminal configured to receive second data; and
      an output terminal configured to output first data according to the second data and the clock signal; and
   the reset circuit further comprises a logic circuit configured to offset the first data by a fixed value so as to update the second data, the logic circuit comprising:
      an input terminal coupled to the output terminal of the flip flop and configured to receive the first data;
      a first output terminal coupled to the input terminal of the flip flop and configured to output the second data; and
      a second output terminal coupled to the output terminal of the reset circuit and configured to perform the reset operation when the first data has not yet reached a constant or configured to stop performing the reset operation when the first data has reached the constant, the constant corresponding to the first predetermined time interval.

6. A control circuit, comprising:
a reset circuit coupled to a digital circuit of a functional circuit and configured to perform a reset operation to the digital circuit; and
a determination circuit coupled to the reset circuit and configured to determine whether a first predetermined time interval has elapsed so as to control the reset circuit to stop performing the reset operation when the first predetermined time interval has elapsed;
wherein the functional circuit further comprises an analog circuit, the digital circuit is coupled to the analog circuit, and the first predetermined time interval corresponds to a time required for the analog circuit to stabilize;
the determination circuit determines whether the first predetermined time interval has elapsed by counting;
the functional circuit further comprises an oscillation source;
the control circuit further comprises:
an operation voltage generation circuit, comprising:
an output terminal coupled to the analog circuit; and
a first capacitor, comprising:
a first terminal coupled to the output terminal of the operation voltage generation circuit; and
a second terminal coupled to the oscillation source;
the reset circuit comprises:
an output terminal configured to perform the reset operation or stop the reset operation; and
the first predetermined time interval corresponds to the time required for a voltage of the first terminal of the first capacitor to reach a ratio of a predetermined voltage; and
the operation voltage generation circuit further comprises a bias voltage generator configured to provide a bias voltage to charge the first capacitor.

* * * * *

UNITED STATES PATENT AND TRADEMARK OFFICE
CERTIFICATE OF CORRECTION

PATENT NO.        : 10,483,963 B2  
APPLICATION NO.   : 15/878363  
DATED             : November 19, 2019  
INVENTOR(S)       : Juang-Shiung Wu Page 1 of 1

It is certified that error appears in the above-identified patent and that said Letters Patent is hereby corrected as shown below:

On the Title Page

Item (30), delete "10612074" and insert --106120174--.

Signed and Sealed this
Seventh Day of January, 2020

Andrei Iancu
*Director of the United States Patent and Trademark Office*